(12) United States Patent
Weng

(10) Patent No.: US 8,193,551 B2
(45) Date of Patent: Jun. 5, 2012

(54) LED PACKAGING STRUCTURE AND FABRICATING METHOD THEREOF

(75) Inventor: Ssu Yuan Weng, Taipei (TW)

(73) Assignee: Everlight Electronics Co., Ltd., New Taipei (TW)

( * ) Notice: Subject to any disclaimer, the term of this patent is extended or adjusted under 35 U.S.C. 154(b) by 245 days.

(21) Appl. No.: 12/588,777

(22) Filed: Oct. 28, 2009

(65) Prior Publication Data

US 2010/0181587 A1    Jul. 22, 2010

(30) Foreign Application Priority Data

Jan. 16, 2009   (TW) ............................... 98101732 A

(51) Int. Cl.
*H01L 33/52* (2010.01)
(52) U.S. Cl. ..... 257/98; 257/99; 257/100; 257/E33.059; 257/E33.061
(58) Field of Classification Search ....... 257/98
See application file for complete search history.

(56) References Cited

U.S. PATENT DOCUMENTS

| | | | |
|---|---|---|---|
| 7,887,225 B2* | 2/2011 | Lee et al. ....................... | 362/561 |
| 2003/0141510 A1* | 7/2003 | Brunner et al. ................ | 257/81 |
| 2004/0100192 A1* | 5/2004 | Yano et al. ..................... | 313/512 |
| 2005/0224830 A1* | 10/2005 | Blonder et al. ............... | 257/100 |
| 2007/0170454 A1* | 7/2007 | Andrews ......................... | 257/100 |
| 2008/0191237 A1* | 8/2008 | Andrews ......................... | 257/100 |
| 2009/0267093 A1* | 10/2009 | Kamada et al. ................ | 257/98 |
| 2009/0283785 A1* | 11/2009 | Kim ............................... | 257/98 |

FOREIGN PATENT DOCUMENTS

| | | |
|---|---|---|
| JP | 2000-340843 | 8/2000 |
| JP | 2002208740 | 7/2002 |
| JP | 2002-261334 | 9/2002 |
| JP | 2003-110153 | 11/2003 |
| JP | 2004-096113 | 3/2004 |
| JP | 2004-363342 | 12/2004 |
| JP | 2005-093601 | 7/2005 |
| JP | 2006-210490 | 8/2006 |
| JP | 2007-066969 | 3/2007 |
| JP | 2007311663 A | 11/2007 |
| JP | 2008-205511 | 9/2008 |
| JP | 2010-080553 | 8/2010 |

* cited by examiner

*Primary Examiner* — Nathan W. Ha
*Assistant Examiner* — Abul Kalam
(74) *Attorney, Agent, or Firm* — Han IP Law PLLC; Andy M. Han

(57) ABSTRACT

A LED (light emitting diode) packaging structure includes a base, a LED chip, a gel-blocking structure and a phosphor layer. The LED chip disposed on the base and electrically connected to the base. The LED chip having a substrate and a semiconductor layer formed on the substrate. The gel-blocking structure is disposed on the substrate of the LED chip and surrounding the semiconductor layer. The phosphor layer is filled within a space defined by the gel-blocking structure, the substrate and the semiconductor layer. The present invention also discloses a fabricating method of the LED packaging structure.

18 Claims, 3 Drawing Sheets

LED PACKAGING STRUCTURE AND FABRICATING METHOD THEREOF

CROSS-REFERENCE TO RELATED APPLICATION

This application claims priority from Taiwan Patent Application No. 098101732 filed on Jan. 16, 2009, which is hereby incorporated herein by reference in its entirety.

FIELD OF THE INVENTION

This invention relates to a light emitting diode packaging structure and fabricating methods thereof, and more particularly, to a light emitting diode packaging structure and fabricating methods that can improve phosphor powder distribution.

BACKGROUND OF THE INVENTION

Due to the characteristics of high brightness, low power consumption and so on, light emitting diode (LED) has rapidly replaced the conventional light sources for illumination in many applications, like display. The light source used for illumination requires high brightness of white light. Therefore, the whole industry now focuses on the research and development of white light LED.

At present, white light LED having high brightness can be obtained by using phosphor powder with blue light chip (such as GaN). The blue light emitted from the chip may excite the phosphor powder to generate another wavelength of light (such as yellow light). By mixing the blue light and the yellow light, an expected white light is obtained. As to the LED packaging, dispensing or surface coating is usually utilized.

The advantage of utilizing dispensing or surface coating to package LED is simple in process. However, the problem of uneven color of light may easily occur in the dispensing process because the quantity of glue can not be easily controlled.

Please refer to FIG. 1, as an example to show the problems of light emitting diode packaging structure in the prior art. In FIG. 1, the conventional light emitting diode packaging structure 10 includes a base 11 on which a pad 13 is provided; a substrate 15; a semiconductor layer 17; an electrode 18; a conducting wire 20 connecting the electrode 18 to the pad 13 on the base 11; and a phosphor encapsulant 22 having phosphor powder for sealing the pad 13, the substrate 15, the semiconductor layer 17, the electrode 18, and the conducting wire 20 on the base 11.

The phosphor encapsulant 22 having a phosphor powder will be formed as a hemisphere shape during a dispensing process. Therefore, the light emitted from the LED may be changed according to the various thickness of the phosphor encapsulant even if the phosphor powder is evenly dispersed within the encapsulanting gel 22, because the light emitted from different regions of the semiconductor layer may pass through different thickness of phosphor encapsulant 22.

The conventional light emitting diode packaging structure is limited to structure and thus can not effectively evenly disperse the phosphor powder. Therefore, it is necessary to have an enhanced light emitting diode packaging structure to overcome the above problems so as to achieve a better color evenness, a faster fabricating process, and a higher yield.

SUMMARY OF THE INVENTION

In order to solve the above and conventional technical problems, one of the objectives of the present invention is to improve the problem of uneven color of light of LED by forming a gel-blocking structure to block the phosphor layer and make the phosphor layer evenly disposed on the semiconductor layer.

In accordance with one aspect of the invention, there is provided a LED (light emitting diode) packaging structure which includes a base, a LED chip, a gel-blocking structure and a phosphor layer. The LED chip is disposed on the base and electrically connected to the base. The LED chip has a substrate and at least a semiconductor layer formed on the substrate. The gel-blocking structure is disposed on the substrate of the LED chip and surround the semiconductor layer. The phosphor layer is filled in a space defined by the gel-blocking structure, the substrate and the semiconductor layer.

In an exemplary embodiment, the light emitting diode packaging structure further includes an encapsulant disposed on the base and cover the LED chip.

In another exemplary embodiment, the gel-blocking structure includes a first metal layer and a second metal layer formed on the first metal layer.

In another exemplary embodiment, the gel-blocking structure is made of material selected from the group consisting of Au, Cr, Cu, Ag, Pt, Ti, Al, and the alloy thereof.

In another exemplary embodiment, the LED chip further includes a first electrode and a second electrode. The first electrode is disposed on a side of the substrate of the LED chip and connected to the base, and the second electrode is disposed on the semiconductor layer.

In another exemplary embodiment, the first electrode is electrically connected to the substrate of the LED chip, and the second electrode is electrically connected to a pad on the base by a conducting wire. The first electrode and the second electrode are each electrically connected to a pad on the base by a conducting wire.

In another exemplary embodiment, the LED chip further includes a first electrode and a second electrode, and the first electrode and the second electrode are opposite to each other and are disposed on the semiconductor layer of the LED chip.

In another exemplary embodiment, the phosphor layer includes at least a phosphor powder and an encapsulating gel.

In accordance with another aspect of the invention, there is provided a method for fabricating a light emitting diode packaging structure, comprising the steps of providing a base; disposing a LED chip on the base and electrically connecting the LED chip to the base, which has a substrate and at least a semiconductor layer formed on the substrate; disposing a gel-blocking structure on the substrate of the LED chip and surround the semiconductor layer; and filling a phosphor layer in a space defined by the gel-blocking structure, the substrate, and the semiconductor layer.

In an exemplary embodiment, the light emitting diode packaging structure further includes an encapsulant disposed on the base and cover the LED chip.

In another exemplary embodiment, the gel-blocking structure is made as forming a first metal layer by evaporation deposition at first and then forming a second metal layer on the first metal layer by electroplating.

In another exemplary embodiment, the gel-blocking structure is made of material selected from the group consisting of Au, Cr, Cu, Ag, Pt, Ti, Al, and the alloy thereof.

In another exemplary embodiment, the LED chip further includes a first electrode and a second electrode, the first electrode is disposed on a side of the substrate of the LED chip and connected to the base, and the second electrode is disposed on the LED chip.

In another exemplary embodiment, the first electrode is electrically connected to the substrate of the LED chip, and the second electrode is electrically connected to a pad on the base.

In another exemplary embodiment, the second electrode is electrically connected to a pad on the base by a conducting wire.

In another exemplary embodiment, the LED chip further includes a first electrode and a second electrode, and the first electrode and the second electrode are opposite to each other and are disposed on the semiconductor layer of the LED chip.

In another exemplary embodiment, the first electrode and the second electrode are each electrically connected to a pad on the base by a conducting wire.

In another exemplary embodiment, the phosphor layer includes at least a kind of phosphor powder and a gel.

BRIEF DESCRIPTION OF DRAWINGS

The objections, functions, features and advantages of the invention will be appreciated more fully from the following further description thereof with reference to the accompanying drawings wherein.

DETAILED DESCRIPTION OF SPECIFIC EMBODIMENTS

The following exemplary examples will be described in detail with the appended drawings in order to make the aforementioned objectives, functional features, and advantages more clearly understood.

Figure 1:
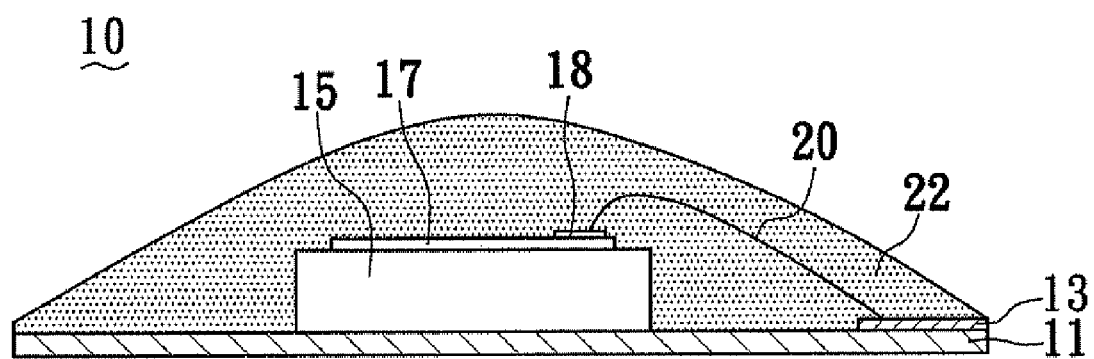
FIG. 1 shows a prior art light emitting diode packaging structure.
Figure 2:
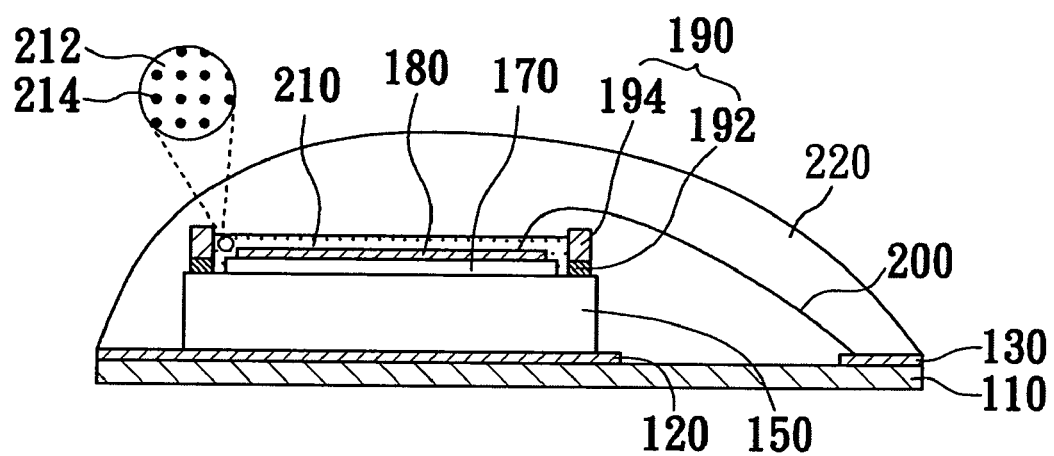
FIG. 2 shows a sectional view of a light emitting diode packaging structure according to a preferred embodiment of the present invention.

FIG. 2 shows a sectional view of a light emitting diode packaging structure according to a preferred embodiment of the present invention. The light emitting diode packaging structure includes a base 110, a LED chip, and a phosphor layer 210. The phosphor layer 210 is made by mixing at least an encapsulating gel 212 and phosphor power 214.

In particular, the LED chip is disposed on the base 110 and electrically connected to the base 110. The LED chip has a substrate 150, at least a semiconductor layer 170 formed on the substrate 150, and a gel-blocking structure 190. The semiconductor layer will use different compounds, such as indium (In) compound or aluminum (Al) nitride, according to the color of the light to be emitted. The semiconductor layer 170 will emit a certain wavelength of light and the emitted light may excite the phosphor layer 210 to generate another wavelength of light. By mixing these two types of lights, an expected color of light is obtained.

It should be noticed that, a gel-blocking structure 190 is disposed on the substrate 150 of the LED chip and is surrounding the semiconductor layer 170. The gel-blocking structure 190 includes a first metal layer 192 and a second metal layer 194 formed on the first metal layer 192. Due to that a metal layer may be quickly formed by electroplating, the gel-blocking structure 190 will form the first metal layer 192 by evaporation deposition at first and then form the second metal layer 194 on the first metal layer 192 by electroplating. Therefore, it can effectively reduce the process time. In an exemplary embodiment, the thickness of the first metal layer 192 is in the range of 0.3 and 2 µm, and the thickness of the second metal layer 194 is in the range of 200 and 300 µm. Furthermore, the gel-blocking structure 190 is made of material selected from the group consisting of Au, Cr, Cu, Ag, Pt, Ti, Al, and the alloy thereof.

Since the light emitting diode packaging structure has a gel-blocking structure 190, the gel-blocking structure 190 may block the phosphor layer 210 and make the phosphor layer 210 evenly cover on the semiconductor layer 170 during the process of filling the phosphor layer 210, so as to solve the problem of uneven color of light of LED.

In an exemplary embodiment, the light emitting diode packaging structure further includes an encapsulant 220 disposed on the base 110 and cover the LED chip.

Figure 3:
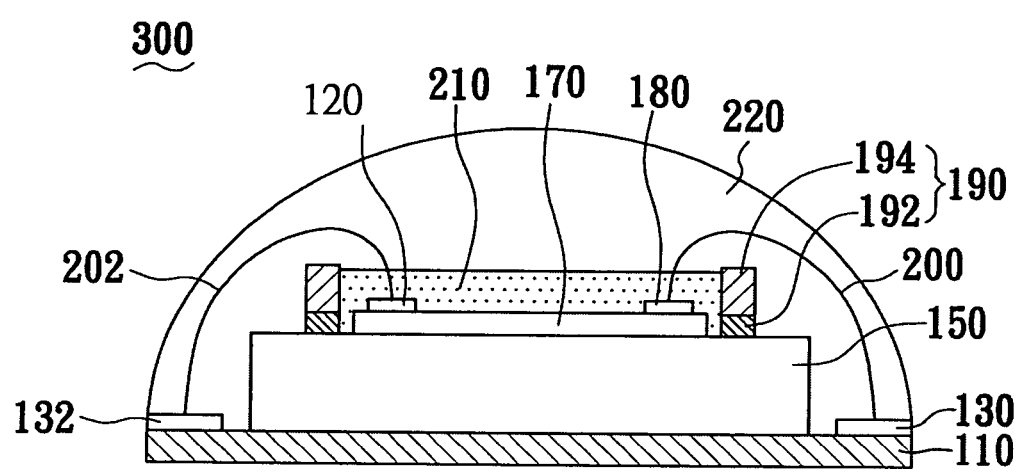
FIG. 3 shows another sectional view of a light emitting diode packaging structure according to a preferred embodiment of the present invention.

The light emitting diode packaging structure of the present invention includes a first electrode 120 and a second electrode 180, the first electrode 120 and the second electrode 180 are disposed differently. In an exemplary embodiment, the first electrode 120 is disposed on a side of the substrate 150 of the LED chip and is connected to the base 110, and the second electrode 180 is disposed on the semiconductor layer 170 of the LED chip. Therefore, a vertically connected light emitting diode packaging structure is obtained. In this vertically connected light emitting diode packaging structure, the first electrode 120 is electrically connected to the substrate 150 of the LED chip, and the second electrode 180 is electrically connected to a pad 130 on the base 110 by a conducting wire 200. Certainly, the first electrode 120 and the second electrode 180 may be both disposed on the semiconductor layer 170 of the base 110, as shown in FIG. 3, and the first electrode 120 and the second electrode 180 are electrically connected to pads 132, 130 on the base 110 by conducting wires 202, 200, respectively.

By utilizing the novel structure of the light emitting diode packaging structure of the present invention, since the light emitting diode packaging structure has a gel-blocking structure 190, the gel-blocking structure 190 may block the phosphor layer 210 and make the phosphor layer 210 and the phosphor powder 214 included therein evenly covered on the surface of the semiconductor layer 170 during filling the phosphor layer 210. When the blue light emitted from the semiconductor layer 170 passes through the phosphor layer 210, the color of the obtained white light is even because of the even thickness of the emitted phosphor layer 210 that makes the excited phosphor powder 214 is dispersed evenly.

The color of white light may be measured by any spectrometer in the market and shown in the Commission Internationale de l'clairage (CIE) coordinates. The CIE is an international organization which specifically establishes the standards of the luminance and color of light. The CIE coordinates are the figures showing the color of light in X-Y coordinates. Take white light for example, it's coordinates are about CIE(x, y)=(0.3, 0.3).

In an exemplary embodiment, the CIE(x) of the center of the LED of the present invention is about 0.30, the CIE(x) of the edge of the LED of the present invention is about 0.32. In comparison with the prior art LED, whose CIE(x) of the center is about 0.30 and whose CIE(x) of the edge is about 0.38, the LED of the present invention obviously enhances the distribution of the color of light. CIE(y) also has similar effect.

It should be noticed that, the substrate of the present invention may be substituted by any suitable substitution, such as SiC, carbides, metal, and so on. The substrate of the present invention may also be selectively connected to a heat dissipation plate or bonding layer depending on the needs. These substitutions and equivalents are obvious for the person skilled in the art.

While various exemplary embodiments of the present invention are described herein, it should be noted that the present invention may be embodied in other specific forms, including various modifications and improvements, without departing from the spirit and scope of the present invention. Thus, the described embodiments are to be considered in all respects only as illustrative and not restrictive.

What is claimed is:

1. A light emitting diode packaging structure, comprising:
    a base;
    a LED chip disposed on the base and electrically connected to the base, the LED chip having a substrate and at least a semiconductor layer formed on the substrate;
    a gel-blocking structure disposed on the substrate of the LED chip and surround the semiconductor layer; and
    a phosphor layer filled within a space defined by the gel-blocking structure, the substrate, and the semiconductor layer,
    wherein the gel-blocking structure includes a first metal layer and a second metal layer formed on the first metal layer.

2. A light emitting diode packaging structure according to claim 1, further comprising an encapsulant disposed on the base and cover the LED chip.

3. A light emitting diode packaging structure according to claim 1, wherein the gel-blocking structure is made of material selected from the group consisting of Au, Cr, Cu, Ag, Pt, Ti, Al, and the alloy thereof.

4. A light emitting diode packaging structure according to claim 1, wherein the LED chip further includes a first electrode and a second electrode, the first electrode is disposed on a side of the substrate of the LED chip and electrically connected to the base, and the second electrode is disposed on the semiconductor layer.

5. A light emitting diode packaging structure according to claim 4, wherein the first electrode is electrically connected to the substrate of the LED chip, and the second electrode is electrically connected to a pad on the base.

6. A light emitting diode packaging structure according to claim 5, wherein the second electrode is electrically connected to the pad on the base by a conducting wire.

7. A light emitting diode packaging structure according to claim 1, wherein the LED chip further includes a first electrode and a second electrode, and the first electrode and the second electrode are opposite to each other and are disposed on the semiconductor layer of the LED chip.

8. A light emitting diode packaging structure according to claim 7, wherein the first electrode and the second electrode are each electrically connected to a pad on the base by a conducting wire.

9. A light emitting diode packaging structure according to claim 1, wherein the phosphor layer includes at least a phosphor powder and an encapsulating gel.

10. A method for fabricating a light emitting diode packaging structure, comprising the steps of:
    providing a base;
    disposing a LED chip on the base and electrically connecting the LED chip to the base, which has a substrate and a semiconductor layer formed on the substrate;
    disposing a gel-blocking structure on the substrate of the LED chip and surround the semiconductor layer; and
    filling a phosphor layer in a space defined by the gel-blocking structure, the substrate, and the semiconductor layer,
    wherein the gel-blocking structure is formed by forming a first metal layer by evaporation deposition at first and then forming a second metal layer on the first metal layer by electroplating.

11. A method according to claim 10, further comprising step of forming an encapsulant on the base and cover the LED chip.

12. A method according to claim 10, wherein the gel-blocking structure is made of material selected from the group consisting of Au, Cr, Cu, Ag, Pt, Ti, Al, and the alloy thereof.

13. A method according to claim 10, wherein the LED chip further includes a first electrode and a second electrode, the first electrode is disposed on a side of the substrate of the LED chip and is connected to the base, and the second electrode is disposed on the semiconductor layer.

14. A method according to claim 13, wherein the first electrode is electrically connected to the substrate of the LED chip, and the second electrode is electrically connected to a pad on the base.

15. A method according to claim 14, wherein the second electrode is electrically connected to the pad on the base by a conducting wire.

16. A method according to claim 10, wherein the LED chip further includes a first electrode and a second electrode, and the first electrode and the second electrode are opposite to each other and are disposed on the semiconductor layer of the LED chip.

17. A method according to claim 16, wherein the first electrode and the second electrode are each electrically connected to a pad on the base by a conducting wire.

18. A method according to claim 10, wherein the phosphor layer includes at least a phosphor powder and an encapsulating gel.

* * * * *